US010231324B2

(12) United States Patent
Lane et al.

(10) Patent No.: US 10,231,324 B2
(45) Date of Patent: Mar. 12, 2019

(54) STAGGERED POWER STRUCTURE IN A POWER DISTRIBUTION NETWORK (PDN)

(71) Applicant: QUALCOMM Incorporated, San Diego, CA (US)

(72) Inventors: Ryan David Lane, San Diego, CA (US); Yue Li, San Diego, CA (US); Charles David Paynter, Encinitas, CA (US); Ruey Kae Zang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 218 days.

(21) Appl. No.: 14/264,836

(22) Filed: Apr. 29, 2014

(65) Prior Publication Data
US 2015/0313006 A1  Oct. 29, 2015

(51) Int. Cl.
*H01L 21/48* (2006.01)
*H05K 1/02* (2006.01)
(Continued)

(52) U.S. Cl.
CPC ..... *H05K 1/0216* (2013.01); *H01L 21/76877* (2013.01); *H01L 21/76895* (2013.01); *H01L 23/49827* (2013.01); *H01L 23/49838* (2013.01); *H01L 23/5286* (2013.01); *H01L 23/525* (2013.01); *H01L 23/5226* (2013.01); *H01L 2224/16225* (2013.01);
(Continued)

(58) Field of Classification Search
CPC . H01L 23/481; H01L 23/5223; H01L 23/552; H01L 21/486; H01L 23/49827; H01L 23/49838; H05K 1/0216

USPC .......................................... 257/692, 734, 659
See application file for complete search history.

(56) References Cited

U.S. PATENT DOCUMENTS 5,949,098 A    9/1999   Mori
6,484,302 B1   11/2002   Freymuth
(Continued)

FOREIGN PATENT DOCUMENTS

| CN | 101877342 A | 11/2010 |
|----|-------------|---------|
| CN | 103125020 A | 5/2013 |
| GB | 2368463 A | 5/2002 |

OTHER PUBLICATIONS

International Search Report and Written Opinion—PCT/US2015/028061—ISA/EPO—dated Aug. 3, 2015.

*Primary Examiner* — Eugene Lee
(74) *Attorney, Agent, or Firm* — Loza & Loza, LLP/Qualcomm

(57) ABSTRACT

Some novel features pertain to an integrated device that includes a first metal layer and a second metal layer. The first metal layer includes a first set of regions. The first set of regions includes a first netlist structure for a power distribution network (PDN) of the integrated device. The second metal layer includes a second set of regions. The second set of regions includes a second netlist structure of the PDN of the integrated device. In some implementations, the second metal layer further includes a third set of regions comprising the first netlist structure for the PDN of the integrated device. In some implementations, the first metal layer includes a third set of regions that includes a third netlist structure for the PDN of the integrated device. The third set of regions is non-overlapping with the first set of regions of the first metal layer.

30 Claims, 12 Drawing Sheets

(51) Int. Cl.
*H01L 21/768* (2006.01)
*H01L 23/498* (2006.01)
*H01L 23/528* (2006.01)
*H01L 23/522* (2006.01)
*H01L 23/525* (2006.01)

(52) U.S. Cl.
CPC .. *H01L 2924/15311* (2013.01); *H05K 1/0225* (2013.01); *H05K 1/0236* (2013.01); *H05K 2201/09309* (2013.01)

(56) References Cited

U.S. PATENT DOCUMENTS

| | | |
|---|---|---|
| 6,609,242 B1 | 8/2003 | Slade |
| 6,891,260 B1* | 5/2005 | Mora .................. H01L 23/4334 257/691 |
| 6,978,433 B1 | 12/2005 | Gan et al. |
| 7,089,522 B2 | 8/2006 | Tan et al. |
| 8,230,375 B2 | 7/2012 | Madurawe |
| 8,344,427 B2 | 1/2013 | Omura |
| 2002/0066591 A1* | 6/2002 | Li ...................... H01L 23/49822 174/255 |
| 2006/0046353 A1* | 3/2006 | Shrowty ................ G11C 5/063 438/129 |
| 2006/0065433 A1* | 3/2006 | Danoski .................. H01L 23/66 174/255 |
| 2010/0072606 A1* | 3/2010 | Yang ..................... H01L 23/481 257/692 |
| 2010/0108373 A1* | 5/2010 | Park .................. H01L 23/49822 174/376 |
| 2012/0313227 A1* | 12/2012 | Or-Bach ............... H01L 23/552 257/659 |
| 2013/0057362 A1* | 3/2013 | Wu ....................... H01P 1/2005 333/204 |
| 2013/0181337 A1* | 7/2013 | Herder ................ H01L 23/5223 257/734 |
| 2017/0017744 A1* | 1/2017 | Swaminathan ..... G06F 17/5036 |

* cited by examiner

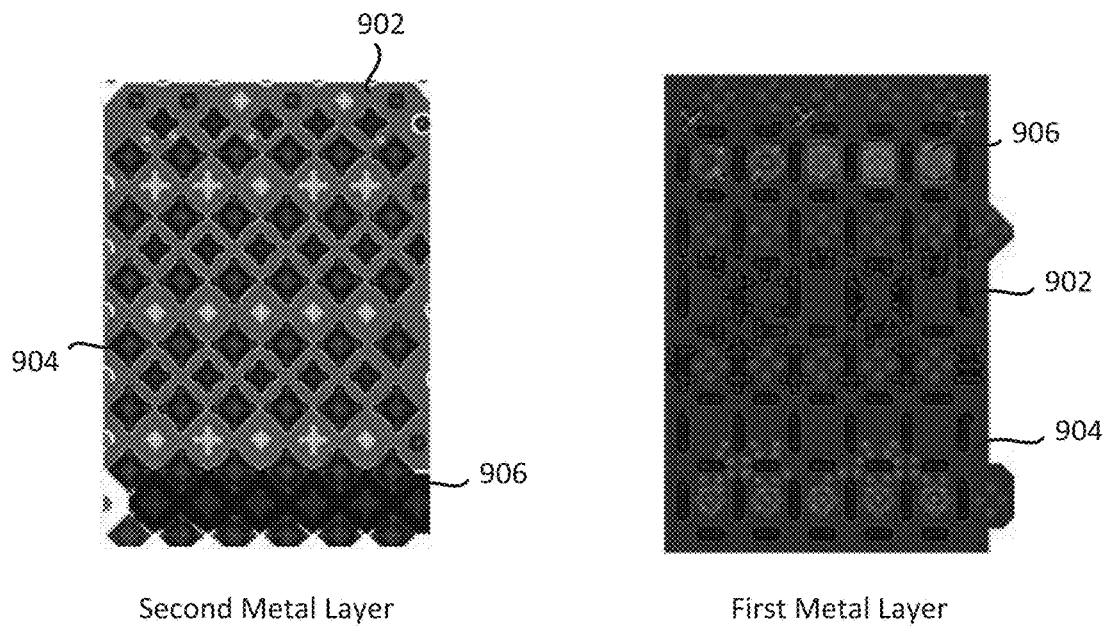
Second Metal Layer
FIG. 13
First Metal Layer
FIG. 14
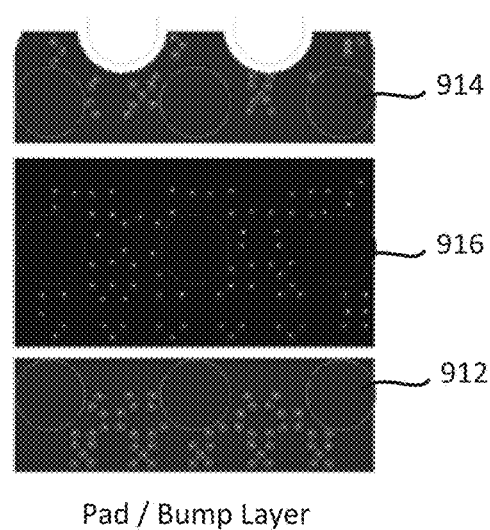
Pad / Bump Layer
FIG. 15

First Metal Layer

Second Metal Layer

First Netlist Structure / Region

Second Netlist Structure / Region

Third Netlist Structure / Region

Fourth Netlist Structure / Region

STAGGERED POWER STRUCTURE IN A POWER DISTRIBUTION NETWORK (PDN)

BACKGROUND

Field

Various features relate to a staggered power distribution structure in a power distribution network (PDN).

Background

A power delivery structure is part of a power distribution network (PDN) that provides power to one or more dies and/or chips. However, power delivery is one of the more challenging problems in high speed signal chip design. When designing a power delivery structure, the power delivery structure needs to provide stable and balanced power support for the die and/or chip.

FIG. 1 illustrates an example of a die package that may include a power distribution network (PDN). Specifically, FIG. 1 illustrates a die package 100 that includes a package substrate 102, a die 104, a first set of solder balls 106, and a second set of solder balls 108. The die 104 is coupled to the package substrate 102 through the first set of solder balls 106. The second set of solder balls 108 is coupled to the packaging substrate 102. The second set of solder balls 108 is coupled to a printed circuit board (PCB) 110. The package substrate includes a set of pads, a set of metal layers, and a set of vias, all of which are not shown. The set of pads, the set of metal layers, and the set of vias are part of a power distribution network that is configured to provide a power signal to the die 104. Typically, the power distribution network will include several metal layers (e.g., 3 or more layers metal layers) in the package substrate 102. As the design of dies has become more complicated, the power distribution network has necessitated the use of many metal layers in the package substrate 102.

There is an ongoing trend to provide thinner dies, die packages and/or chips. As such, there is a trend to provide low profile packages (e.g., packages that are thinner and/or have lesser layers). However, low profile packages come with difficult design challenges. In particular, low profile packages are difficult to design because of parasitic problems due to the fact that that interconnects (e.g., metal layers in the package substrate) in the power delivery structure are so close to each other.

Therefore, there is a need for a power delivery structure for a power distribution network (PDN) in a low profile package that minimizes parasitic effects. Ideally, such a power delivery structure will provide stable and full area coverage (or near full area coverage) power delivery structure in a low profile package.

SUMMARY

Various features, apparatus and methods described herein provide a staggered power distribution structure in a power distribution network (PDN).

A first example provides an integrated device that includes a first metal layer and a second metal layer. The first metal layer includes a first set of regions. The first set of regions includes a first netlist structure for a power distribution network (PDN) of the integrated device. The second metal layer includes a second set of regions. The second set of regions includes a second netlist structure of the PDN of the integrated device.

According to an aspect, the second metal layer further includes a third set of regions comprising the first netlist structure for the PDN of the integrated device.

According to one aspect, the second metal layer further comprises a third set of island regions comprising the first netlist structure for the PDN of the integrated device.

According to an aspect, the first metal layer further comprises a third set of regions includes a third netlist structure for the PDN of the integrated device. The third set of regions is non-overlapping with the first set of regions of the first metal layer.

According to one aspect, the integrated device further includes a set of vias configured to couple the first set of regions.

According to an aspect, the first set of regions includes a set of repeating pattern regions that defines a substantial portion of the first metal layer.

According to one aspect, the first set of regions includes a set of repeating pattern regions formed in one of at least a star formation, an offset formation, a staggered formation, and/or a hub and spoke formation.

According to an aspect, the first netlist structure comprises a first set of interconnects, and the second netlist structure comprising a second set of interconnects.

According to one aspect, the power distribution structure may be implemented in one of at least a printed circuit board (PCB), a redistribution portion of a die, a wafer level die, a wafer level package (WLP), an embedded wafer level package (eWLP), an embedded wafer level ball grid array (eWLB), and/or an integrated fan out (INFO) wafer level package.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a substrate that includes a first metal layer and a second metal layer. The first metal layer includes a first set of regions. The first set of regions includes a first netlist structure for a power distribution network (PDN) of the substrate. The second metal layer includes a second set of regions. The second set of regions includes a second netlist structure of the PDN of the substrate.

According to an aspect, second metal layer further comprises a third set of regions comprising the first netlist structure for the PDN of the substrate.

According to one aspect, the second metal layer further comprises a third set of island regions comprising the first netlist structure for the PDN of the substrate.

According to an aspect, the first metal layer further includes a third set of regions. The third set of regions includes a third netlist structure for the PDN of the substrate. The third set of regions is non-overlapping with the first set of regions of the first metal layer.

According to one aspect, the substrate includes a set of vias configured to couple the first set of regions.

According to an aspect, the first set of regions includes a set of repeating pattern regions that defines a substantial portion of the first metal layer.

According to one aspect, the first set of regions includes a set of repeating pattern regions formed in one of at least a star formation, an offset formation, a staggered formation, and/or a hub and spoke formation.

According to an aspect, the first netlist structure comprises a first set of interconnects, and the second netlist structure comprising a second set of interconnects.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating an integrated device. The method forms a first metal layer, where forming the first metal layer includes forming a first netlist structure for a power distribution network (PDN) of the integrated device in a first set of regions of the first metal layer. The method forms a second metal layer, where forming the second metal layer includes forming a second netlist structure for the PDN of the integrated device in a second set of regions of the second metal layer.

According to an aspect, forming the first metal layer further includes forming a third netlist structure for the PDN of the integrated device in a third set of regions of the first metal layer, where the third set of regions is non-overlapping with the first set of regions of the first metal layer.

According to one aspect, the method further forms a set of vias configured to couple the first set of regions.

According to an aspect, the first set of regions includes a set of repeating pattern regions formed in one of at least a star formation, an offset formation, a staggered formation, and/or a hub and spoke formation.

According to one aspect, the power distribution structure may be implemented in one of at least a printed circuit board (PCB), a redistribution portion of a die, a wafer level die, a wafer level package (WLP), an embedded wafer level package (eWLP), an embedded wafer level ball grid array (eWLB), and/or an integrated fan out (INFO) wafer level package.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a method for fabricating a substrate. The method forms a first metal layer, where forming the first metal layer includes forming a first netlist structure for a power distribution network (PDN) of the substrate in a first set of regions of the first metal layer. The method forms a second metal layer, where forming the second metal layer includes forming a second netlist structure for the PDN of the substrate in a second set of regions of the second metal layer.

According to an aspect, forming the first metal layer further includes forming a third netlist structure for the PDN of the substrate in a third set of regions of the first metal layer, where the third set of regions is non-overlapping with the first set of regions of the first metal layer.

According to one aspect, the method forms a set of vias configured to couple the first set of regions.

According to an aspect, the first set of regions includes a set of repeating pattern regions formed in one of at least a star formation, an offset formation, a staggered formation, and/or a hub and spoke formation.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

FIG. 13 illustrates a plan view of a second metal layer of a power distribution structure.

FIG. 14 illustrates a plan view of a first metal layer of a power distribution structure.

FIG. 15 illustrates a plan view of a pad/bump layer of a power distribution structure.

DETAILED DESCRIPTION

Figure 1:
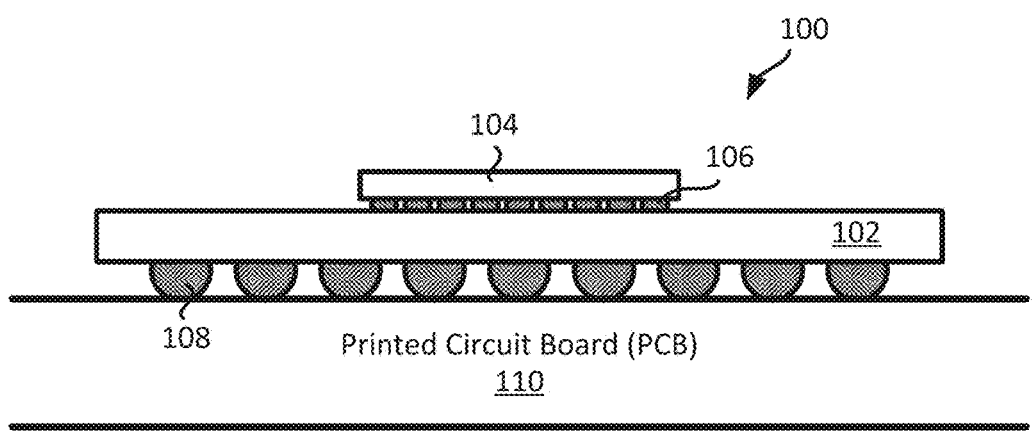
FIG. 1 illustrates a profile view of a die package coupled to a printed circuit board.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device that includes a first netlist structure in a first region of a first metal layer, a second netlist structure in a second region of a second metal layer, and a third netlist structure in a third region of the first metal layer and a fourth region of the second metal layer. The third region includes a first set of repeating pattern regions. The fourth region includes a second set of repeating pattern regions. The first netlist structure, the second netlist structure, and the third netlist structure are configured to operate as a power distribution structure in the integrated device. In some implementations, the first region, the second region, and the third region are defined in the first and second metal layers such that they at least substantially (e.g., at least 90%) utilize all of the surface area of the first and second metal layers. In some implementations, the integrated device further includes a set of vias configured to couple the third region to the fourth region. In some implementations, the first region is non-overlapping with the third region. In some implementations, the second region is non-overlapping with the fourth region. In some implementations, the first netlist structure includes a first set of interconnects. In some implementations, the second netlist structure includes a second set of interconnects. In some implementations, the third netlist structure includes a fourth set of interconnects regions. In some implementations, the integrated device includes a fourth netlist structure in a fifth region of the first metal layer and a sixth region of the second metal layer. The fifth region includes a third set of repeating pattern regions. The sixth region includes a fourth set of repeating pattern regions, where the first netlist structure, the second netlist structure, the third netlist structure, and the fourth netlist structure are configured to operate as the power distribution structure in the integrated device.

Exemplary Power Distribution Structure

FIGS. 2-6 illustrate an example of how a power distribution network may be substantially evenly spread out over one or more metal layers of an integrated device and/or substrate by dividing the metal layers into different regions (e.g., staggered island regions), which (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance.

Figure 2:
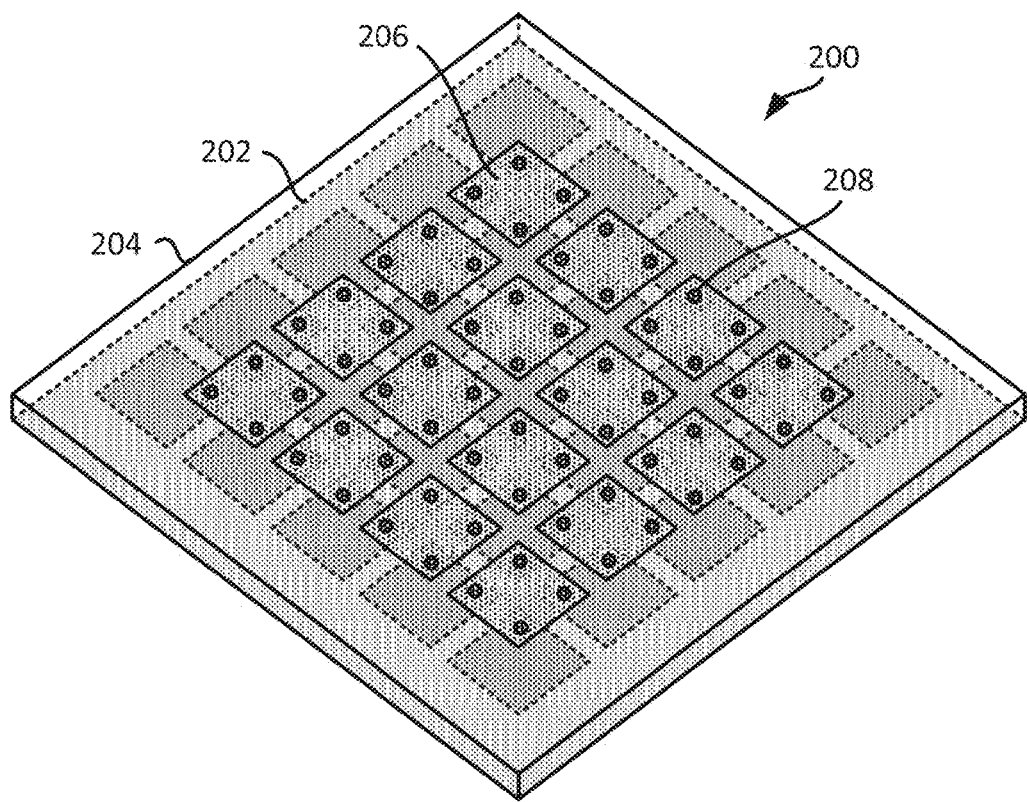
FIG. 2 illustrates an angled view of netlist regions of a power distribution structure.

FIG. 2 illustrates an angled view of a power distribution structure 200 that may be implemented in an integrated device and/or a substrate. In some implementations, the power distribution structure 200 is part of a power distribution network (PDN) that provides power to/from an integrated device.

In some implementations, the power distribution network includes a first netlist, a second netlist and a third netlist. In some implementations, a netlist is defined as a set of interconnects, a set of active elements (e.g., transistor) and/or a set of passive elements (e.g., resistor, capacitor) that form and/or define the connectivity of a circuit in an integrated device. In some implementations, an interconnect may include a trace, a via, a pad, and/or a redistribution metal layer. In some implementations, the first netlist is a first power signal netlist, the second netlist is a second power signal netlist, and the third netlist is a ground signal netlist. In some implementations, the power distribution structure 200 is configured to provide a first power signal, a second power signal, and a ground signal to/from an integrated device.

The power distribution structure 200 may be implemented in different parts of an integrated device. In some implementations, the power distribution structure 200 may be implemented in a printed circuit board (PCB), a package substrate, a redistribution portion (e.g., redistribution layers) of a die, a wafer level die, a wafer level package (WLP), an embedded wafer level package (eWLP), an embedded wafer level ball grid array (eWLB), and/or an integrated fan out (INFO) wafer level package.

In some implementations, the power distribution structure 200 provides several advantages to an integrated device. For example, when the power distribution structure 200 is coupled to several bumps and/or solder balls, the even distribution of the power distribution structure 200 across the entire metal layer(s) of the integrated device (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance.

As shown in FIG. 2, the power distribution structure 200 includes a first netlist structure region 202, a second netlist structure region 204, a set of third netlist structure regions 206, and a set of via regions 208. The first netlist structure region 202 may include one or more interconnects for a first netlist. The second netlist structure region 204 may include one or more interconnects for a second netlist. The set of third netlist structure regions 206 may include one or more interconnects for a third netlist. The set of via regions 208 may include one or more vias for a first netlist, a second netlist, and/or a third netlist.

In some implementations, the first netlist structure region 202 includes a first set of interconnects configured to provide a first power signal to an integrated device that includes the power distribution structure 200. In some implementations, the second netlist structure region 204 includes a second set of interconnects configured to provide a second power signal to an integrated device that includes the power distribution structure region 200. In some implementations, the set of third netlist structure regions 206 includes a third set of interconnects configured to provide a ground signal to an integrated device that includes the power distribution structure 200.

As shown in FIG. 2, the power distribution structure 200 is formed in two metal layers of an integrated device. The two metal layers of the integrated device may be metal layers of a printed circuit board (PCB), a package substrate, a redistribution portion (e.g., redistribution layers) of a die, a wafer level die, a wafer level package (WLP), an embedded wafer level package (eWLP), an embedded wafer level ball grid array (eWLB), and/or an integrated fan out (INFO) wafer level package.

The power distribution structure 200 is configured in such a way as to minimize parasitic effects on the power distribution network. In some implementations, this is achieved by reducing and/or minimizing the number of overlaps (e.g., vertical overlaps) between interconnects from different netlist structures. For example, a first interconnect from a first netlist may be placed on a first metal layer such that it does not overlap (e.g., vertically overlap) with a second interconnect from a second netlist on a second metal layer.

FIG. 2 illustrates that (i) the first netlist structure region 202 is on a first metal layer of the integrated device or substrate, (ii) the second netlist structure region 204 is on a second metal layer of the integrated device or substrate, (iii), the set of third netlist structure regions 206 is on both the first metal layer and the second metal layer of the integrated device or substrate, and (iv) the set of via regions are located between the first and second metal layers of the integrated device or substrate.

In some implementations, the first netlist structure region 202 defines a region of the first metal layer that includes one or more interconnects (e.g., traces) that are part of a first netlist. In some implementations, the first netlist structure region 202 defines a region (e.g., contiguous region) of the first metal layer that includes one or more interconnects (e.g., traces) that are only part of the first netlist. It should be noted that the first netlist structure region 202 does not necessarily represent how the interconnects (e.g., traces) are formed on the first metal layer of the integrated device.

In some implementations, the second netlist structure region 204 defines a region of the second metal layer that includes one or more interconnects (e.g., traces) that are part of a second netlist. In some implementations, the second netlist structure region 204 defines a region (e.g., contiguous region) of the second metal layer that includes one or more interconnects (e.g., traces) that are only part of the second netlist. It should be noted that the second netlist structure region 204 does not necessarily represent how the interconnects (e.g., traces) are formed on the second metal layer of the integrated device.

In some implementations, the set of third netlist structure regions 206 defines regions (e.g., island regions) of the first and second metal layers that include one or more interconnects (e.g., traces) that are part of a third netlist. In some implementations, the set of third netlist structure regions 206 defines regions of the first and second metal layers that include one or more interconnects (e.g., traces) that are only part of the third netlist. It should be noted that the third netlist structure region 206 does not necessarily represent how the interconnects (e.g., traces) are formed on the first and second metal layers of the integrated device. As shown in FIG. 2, the set of third netlist structure region 206 includes several regions that are repeated several times in the integrated device. That is, there are several third netlist structure regions that are located in the first metal layer and the second metal layer. In some implementations, each of these third netlist structure regions 206 are spaced apart (e.g., uniformly apart) from each other in a staggered, offset and/or island formation (e.g., star formation, offset formation, staggered formation, hub and spoke formation). In some implementations, two or more first netlist structure regions 202 are electrically coupled to each other through one or more set of via regions 208.

In some implementations, the set of via regions 208 are located in the integrated device such that the set of via regions 208 overlaps (e.g., vertically overlaps) with a third netlist structure region 206 from a first layer and another third netlist structure region 206 from a second layer. Each of the set of via regions 208 may include one or more vias. It should be noted that the set of via regions 208 does not necessarily represent how the vias look between the first and second metal layers of the integrated device.

In some implementations, the first netlist structure region 202, the second netlist structure region 204, and the set of third netlist structure regions 206 are configured in the first and second metal layers such that they at least substantially (e.g., about 90% or higher) or completely utilize all of the surface area of the first and second metal layers of the integrated device, thereby maximizing the use of space available for a power distribution network, while at the same time, minimizing parasitic effects, impedance and/or resistance in the power distribution network.

In some implementations, the first netlist structure region 202, the second netlist structure region 204, and the third netlist structure regions 206 are separated by one or more non-conducting regions (e.g., dielectric layer). In some implementations, the boundaries of the first netlist structure region 202, the second netlist structure region 204, and the third netlist structure regions 206 are defined and/or surrounded by one or more non-conducting regions (e.g., dielectric region). This ensures that regions from different netlist structures within the same metal layers are not in contact with each other so as to create a short in the circuit.

Figure 6:
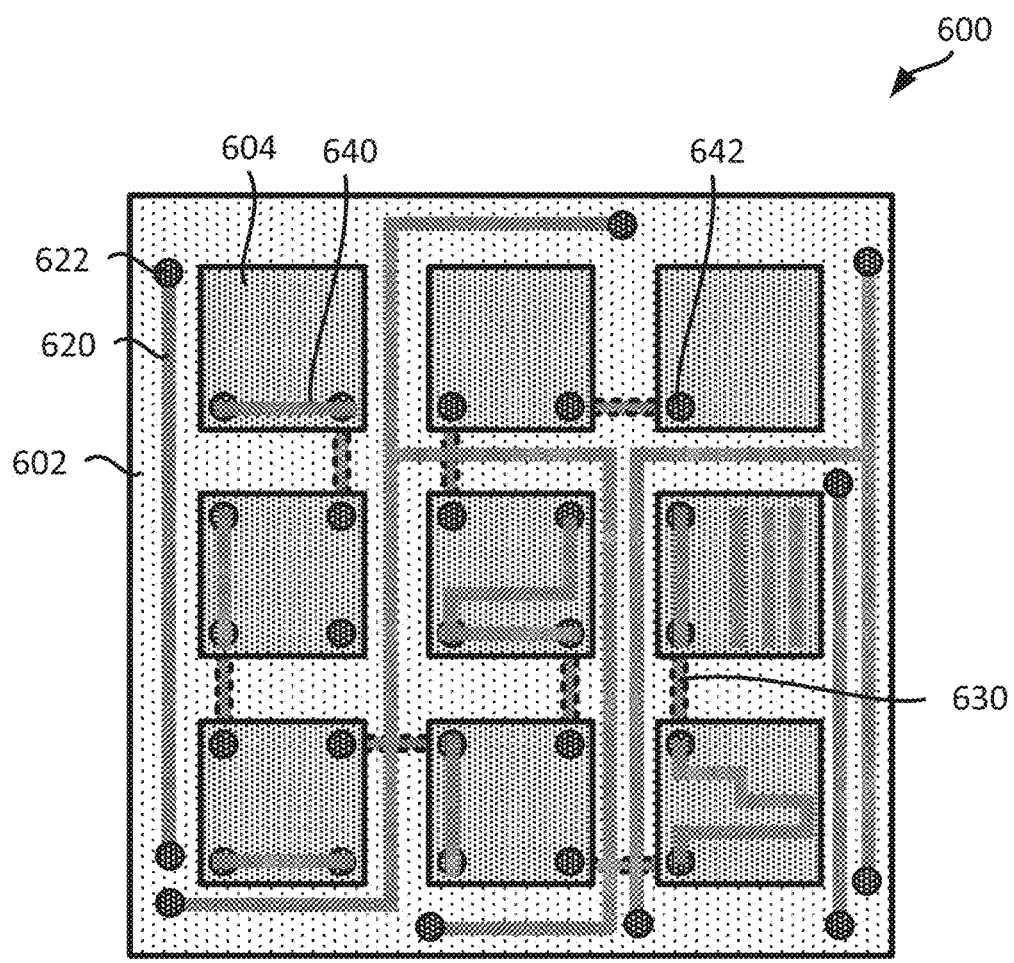
FIG. 6 illustrates a plan view of a metal layer subdivided in several netlist regions that includes interconnects.

Examples of netlists, netlist structures in a netlist structure region will be further described in FIG. 6.

Figure 3:
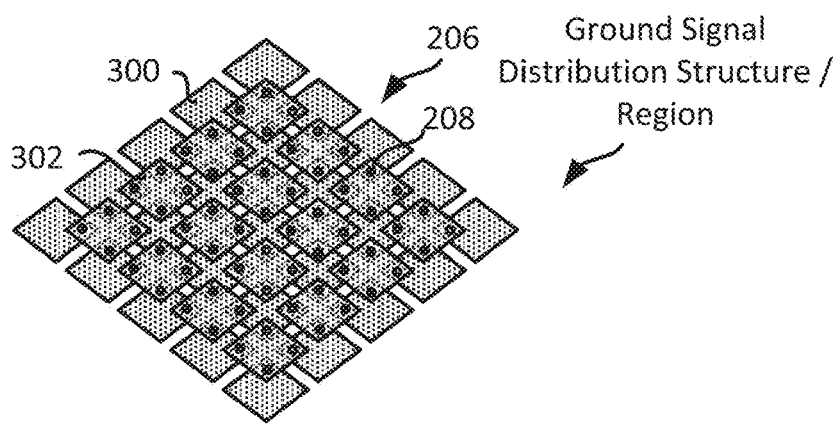
FIG. 3 illustrates an angled view of a third netlist region of a power distribution structure.
Figure 4:
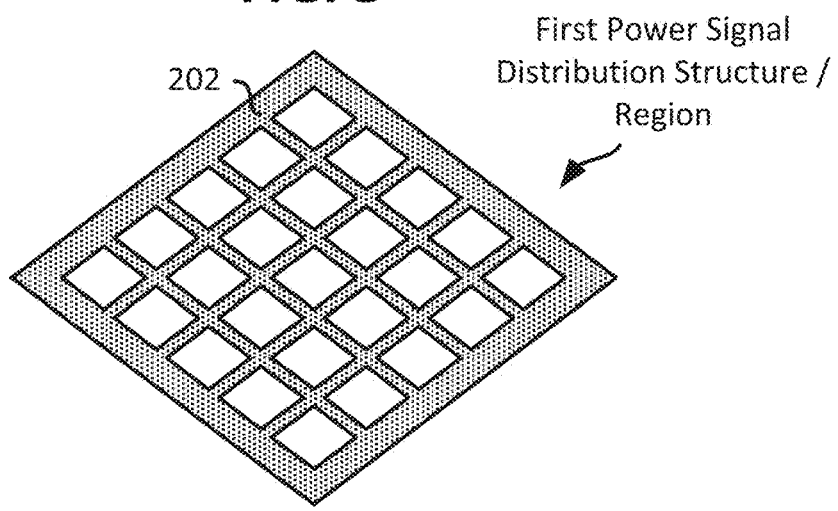
FIG. 4 illustrates an angled view of a first netlist region of a power distribution structure.
Figure 5:
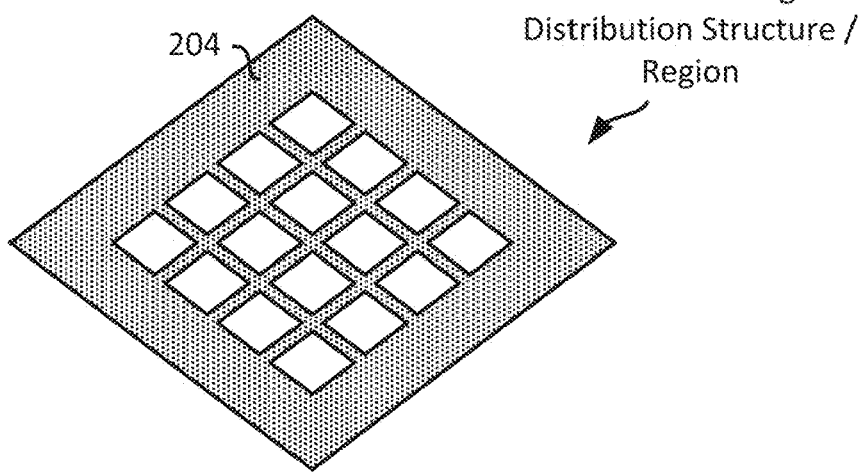
FIG. 5 illustrates an angled view of a second netlist region of a power distribution structure.

FIGS. 3-5 illustrate different regions of the power distribution structure 200 of FIG. 2. FIG. 3 illustrates an angled view of the set of third netlist structure regions 206 of the power distribution structure 200 that may be implemented in an integrated device or substrate. In some implementations, the set of third netlist structure regions 206 is configured to provide a ground signal to/from an integrated device. However, in some implementations, the set of third netlist structure regions 206 may be configured to provide a power signal to/from an integrated device.

As shown in FIG. 3, the set of third netlist structure regions 206 includes a first set of netlist structure regions 300 and a second set of netlist structure regions 302. The first set of netlist structure regions 300 is located in a first metal layer of an integrated device. The second set of netlist structure regions 302 is located in a second metal layer of the integrated device. In some implementations, the regions 300 and 302 are spaced apart (e.g., uniformly apart) from each other in a staggered, offset and/or island formation (e.g., star formation, offset formation, staggered formation, hub and spoke formation). In some implementations, two or more netlist structure regions 300 and/or 302 are electrically coupled to each other through one or more set of via regions 208. FIG. 3 illustrates that the set of third netlist structure region 206 includes a first repeating pattern of regions 300, and a second repeating pattern of regions 302.

It should be noted that the set of third netlist structure regions 206 is a representation of a region in an integrated device or substrate that includes a power distribution structure. Thus, in some implementations, the set of third netlist structure regions 206 is not an actual representation of a netlist structure, but rather is one or more regions that includes interconnects that define a netlist structure. However, in some implementations, the set of third netlist structure region 206 may represent the actual (or close to the actual representation of a) netlist structure of a power distribution network.

FIG. 4 illustrates an angled view of the first netlist structure region 202 of the power distribution structure 200 that may be implemented in an integrated device or substrate. As shown in FIG. 4, the first netlist structure region 202 is on a first metal layer of an integrated device. In some implementations, the first netlist structure region 202 is configured to provide a first power signal to/from an integrated device. However, the first netlist structure region 202 may be configured to provide a ground signal to/from an integrated device. In some implementations, the first netlist structure region 202 is formed on the first metal layer such that the first netlist structure region 202 substantially surrounds the first set of netlist structure regions 300. In some implementations, this configuration allows for minimal (about 10% or less) or no overlap of interconnects from different netlists.

It should be noted that the first netlist structure region 202 is a representation of a region in an integrated device that includes a power distribution structure. Thus, in some implementations, the first netlist structure region 202 is not an actual representation of a netlist structure, but rather is one or more regions that includes interconnects that define a netlist structure. However, in some implementations, the first netlist structure region 202 may represent the actual (or close to the actual representation of a) netlist structure of a power distribution network.

FIG. 5 illustrates an angled view of the second netlist structure region 204 of the power distribution structure 200 that may be implemented in an integrated device. As shown in FIG. 5, the second netlist structure region 204 is on a second metal layer of an integrated device or substrate. In some implementations, the second netlist structure region 204 is configured to provide a second power signal to/from an integrated device. However, the second netlist structure region 204 may be configured to provide a ground signal to/from an integrated device. In some implementations, the second netlist structure region 204 is formed on the second metal layer such that the second netlist structure region 204 substantially surrounds the second set of netlist structure regions 302. In some implementations, this configuration allows for minimal (about 10% or less) or no overlap of interconnects from different netlists.

It should be noted that the second netlist structure region 204 is a representation of a region in an integrated device that includes a power distribution structure. Thus, in some implementations, the second netlist structure region 204 is not an actual representation of a netlist structure, but rather is one or more regions that includes interconnects that define a netlist structure. However, in some implementations, the second netlist structure region 204 may represent the actual (or close to the actual representation of a) netlist structure of a power distribution network.

As mentioned above, in some implementations, a netlist structure region (e.g., netlist structure regions 202, 204 and/or 206) may represent a region that includes interconnects that define a netlist structure. FIG. 6 illustrates a metal layer of a power distribution structure in an integrated device in some implementations. As shown in FIG. 6, a power distribution structure 600 includes a first netlist structure region 602 and a set of second netlist structure regions 604. In some implementations, the first netlist structure region 602 is configured to provide a first netlist structure that provides a power signal to/from an integrated device. In some implementations, the set of second netlist structure regions 604 is configured to provide a second netlist structure that provides a ground signal to/from an integrated device.

The first netlist structure region 602 includes a set of first interconnects 620 (e.g., traces), and a set of first vias 622. In some implementations, the set of first interconnects 620 and/or the set of first vias 622 define a netlist and/or netlist structure that provides a power signal to/from an integrated device. In some implementations, the first netlist structure region 602 is a contiguous region of a metal layer that surrounds the set of second netlist structure regions 604.

The set of second netlist structure regions 604 includes a set of second interconnects 640 (e.g., traces), and a set of second vias 642. In some implementations, the set of second interconnects 640 and/or the set of second vias 642 define a netlist and/or netlist structure that provides a ground signal to/from an integrated device. In some implementations, the set of second netlist structure regions 604 includes several regions (e.g., island regions) that are spaced apart (e.g., evenly apart) from each other in a staggered, offset, and/or island formation (e.g., star formation, offset formation, staggered formation, hub and spoke formation). In some implementations, the second netlist structure regions 604 may be coupled to each other through a set of interconnects 630 (which are shown as dashed interconnects) that are located on a different metal layer of the integrated device. In some implementations, one or more of the second netlist structure region 604 represents the actual shape and/or size of the interconnects of the netlist structure.

FIGS. 2-6 illustrate how a power distribution network may be substantially evenly spread out over one or more metal layers of an integrated device and/or substrate by dividing the metal layers into different regions (e.g., island regions, contiguous regions), which as described above (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance. In some implementations, one or more of the metal layers includes a set of repeating pattern regions (e.g., island regions) such that about at least 90% of the metal layer is defined by the set of repeating pattern regions. In some implementations, at least one of the metal layers includes at least 100 repeating pattern regions. In some implementations, at least one of the metal layers includes at least 1000 repeating pattern regions.

It should be noted that the one or more regions (e.g., island regions, contiguous regions) may have similar or different sizes and shapes, and is not limited to the sizes and/or shapes shown in FIGS. 2-6. In addition, the use of regions for different netlists is not limited to two metal layers. In some implementations, more than two metal layers of an integrated device or substrate may be implemented with regions that are spaced apart from each other in a staggered, offset, and/or island formation.

Exemplary Integrated Device

As described above, a power distribution structure may be formed in the metal layers of an integrated device and/or a substrate. The metal layers of the integrated device may be metal layers of a printed circuit board (PCB), a package substrate, a redistribution portion (e.g., redistribution layers) of a die, a wafer level die, a wafer level package (WLP), an embedded wafer level package (eWLP), an embedded wafer level ball grid array (eWLB), and/or an integrated fan out (INFO) wafer level package.

Figure 7:
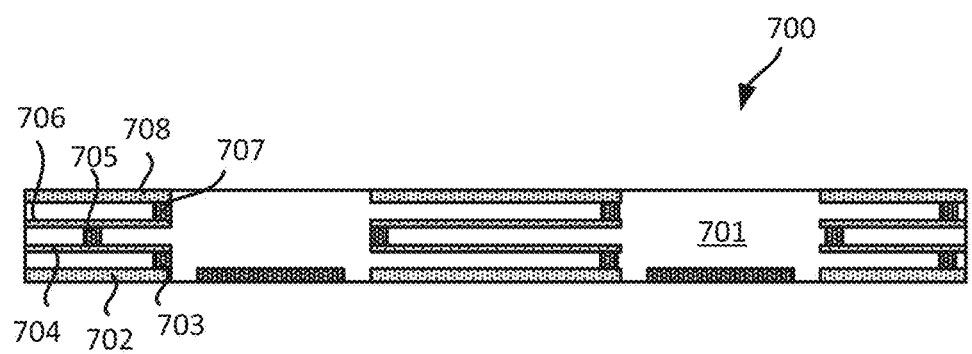
FIG. 7 illustrates a substrate that may include a power distribution structure.

FIG. 7 illustrates a profile view of a substrate 700 that includes a power distribution structure as described in the present disclosure. In some implementations, the substrate 700 is a package substrate. In some implementations, the substrate 700 may be a printed circuit board (PCB).

The substrate 700 includes a dielectric layer 701, a first set of pads 702, a first set of vias 703, a set of first metal layers 704, a second set of vias 705, a set of second metal layers 706, a third set of vias 707, and a second set of pads 708.

In some implementations, the dielectric layer 701 includes one dielectric layer 701, while in other implementations, the dielectric layer 701 may include several dielectric layers.

The first set of pads is coupled to the first set of vias 703. The first set of vias 703 is coupled to the set of first metal layers 704. The set of first metal layers 704 is coupled to the second set of vias 705. The second set of vias 705 is coupled to the set of second metal layers 706. The set of second metal layers 706 is coupled to the third set of vias 707. The third set of vias 707 is coupled to the second set of pads 708.

In some implementations, the set of first metal layers 704, the second set of vias 705, and/or the set of second metal layers 706 are configured to operate as a power distribution structure that is consistent with one or more of the power distribution structures described in the present disclosure.

Figure 8:
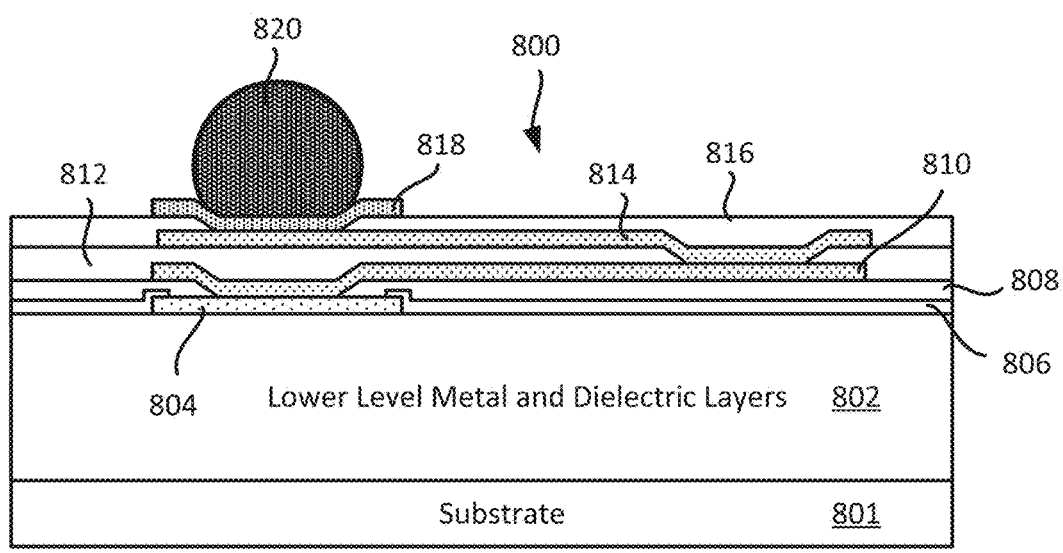
FIG. 8 illustrates an integrated device that may include a power distribution structure.

FIG. 8 illustrates a profile view of a portion of a wafer 800 that includes a power distribution structure as described in the present disclosure. In some implementations, the wafer 800 is a wafer level die. The wafer 800 includes a substrate 801, several metal and dielectric layers 802, a pad 804, a passivation layer 806, a first insulation layer 808, a first metal layer 810, a second insulation layer 812, a second metal layer 814, a third insulation layer 816, and an under bump metallization (UBM) layer 818. FIG. 8 also illustrates a solder ball 820 on the wafer 800. Specifically, the solder ball 820 is coupled to the UBM layer 818. The pad 804, the first metal layer 810 and the UBM layer 820 are a conductive material (e.g., copper). The first insulation layer 808, the second insulation layer 812, and the third insulation layer 816 may include one of at least polyimide layers (PI), Polybenzoxazole (PBO) or other polymer layers used for repassivation. The first metal layer 810 and the second metal layer 814 are respectively a first redistribution layer, and a second redistribution layer. In some implementations, the first metal layer 810 and the second metal layer 814 are configured operate as a power distribution structure that is consistent with one or more of the power distribution structures described in the present disclosure.

Exemplary Power Distribution Structure

Figure 9:
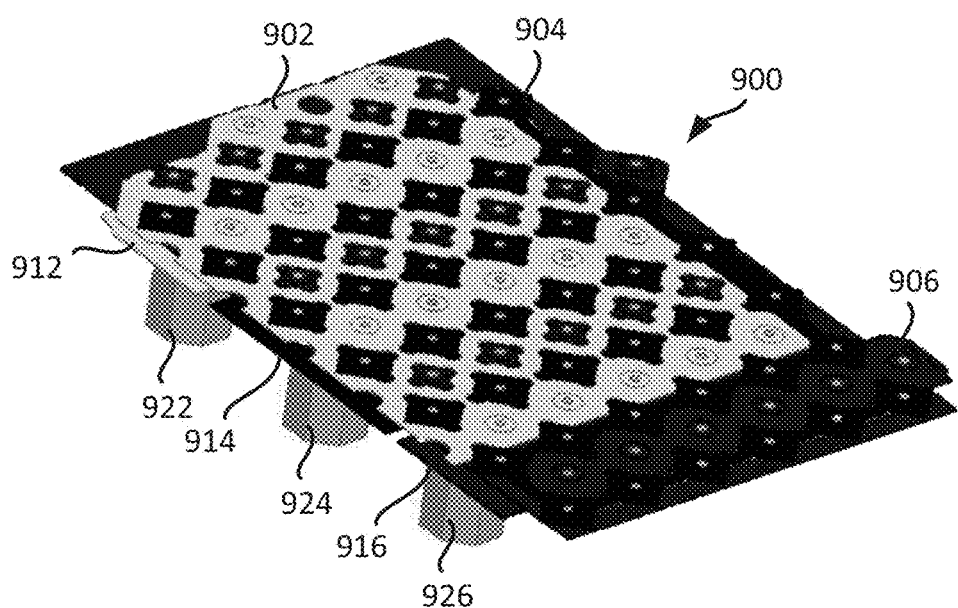
FIG. 9 illustrates an angled view of netlist regions of another power distribution structure.

FIG. 9 illustrates an angled view of a power distribution structure 900 that may be implemented in an integrated device and/or a substrate. In some implementations, the power distribution structure 900 is part of a power distribution network (PDN) that provides power to/from an integrated device.

In some implementations, the power distribution network includes a first netlist, a second netlist and a third netlist. In some implementations, a netlist is defined as a set of interconnects, a set of active elements (e.g., transistor) and/or a set of passive elements (e.g., resistor, capacitor) that form and/or define the connectivity of a circuit in an integrated device. In some implementations, an interconnect may include a trace, a via, a pad, and/or a redistribution metal layer. In some implementations, the first netlist is a first power signal netlist, the second netlist is a second power signal netlist, and the third netlist is a ground signal netlist. In some implementations, the power distribution structure 900 is configured to provide a first power signal, a second power signal, and a ground signal to/from an integrated device.

The power distribution structure 900 may be implemented in different parts of an integrated device. In some implementations, the power distribution structure 900 may be implemented in a printed circuit board (PCB), a package substrate, a redistribution portion (e.g., redistribution layers) of a die, a wafer level die, a wafer level package (WLP), an embedded wafer level package (eWLP), an embedded wafer level ball grid array (eWLB), and/or an integrated fan out (INFO) wafer level package.

In some implementations, the power distribution structure 900 provides several advantages to an integrated device. For example, when the power distribution structure 900 is coupled to several bumps and/or solder balls, the even distribution of the power distribution structure 900 across the entire metal layer(s) of the integrated device (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance.

As shown in FIG. 9, the power distribution structure 900 includes a first netlist structure region 902, a second netlist structure region 904, a set of third netlist structure regions 906, and a set of via regions 908. The first netlist structure region 902 may include one or more interconnects for a first netlist. The second netlist structure region 904 may include one or more interconnects for a second netlist. The set of third netlist structure regions 906 may include one or more interconnects for a third netlist. The set of via regions 908 may include one or more vias for a first netlist, a second netlist, and/or a third netlist.

In some implementations, the first netlist structure region 902 includes a first set of interconnects configured to provide a first power signal to an integrated device that includes the power distribution structure 900. In some implementations, the second netlist structure region 904 includes a second set of interconnects configured to provide a second power signal to an integrated device that includes the power distribution structure region 900. In some implementations, the set of third netlist structure regions 906 includes a third set of interconnects configured to provide a ground signal to an integrated device that includes the power distribution structure 900.

As shown in FIG. 9, the power distribution structure 900 is formed in two metal layers of an integrated device. The two metal layers of the integrated device may be metal layers of a printed circuit board (PCB), a package substrate, a redistribution portion (e.g., redistribution layers) of a die, a wafer level die, a wafer level package (WLP), an embedded wafer level package (eWLP), an embedded wafer level ball grid array (eWLB), and/or an integrated fan out (INFO) wafer level package.

The power distribution structure 900 is configured in such a way as to minimize parasitic effects on the power distribution network. In some implementations, this is achieved by reducing and/or minimizing the number of overlaps (e.g., vertical overlaps) between interconnects from different netlist structures. For example, a first interconnect from a first netlist may be placed on a first metal layer such that it does not overlap (e.g., vertically overlap) with a second interconnect from a second netlist on a second metal layer.

FIG. 9 illustrates that (i) the first netlist structure region 902 is on both a first and second metal layers of the integrated device, (ii) the second netlist structure region 904 is on both the first and second metal layers of the integrated device, (iii), the set of third netlist structure regions 906 is on both the first metal layer and the second metal layer of the integrated device, and (iv) the set of via regions are located between the first and second metal layers of the integrated device.

FIG. 9 further illustrates a pad region 912, a second pad region 914, and a third pad region 916. The first pad region 912 is coupled to the first netlist structure region 902. The second pad region 914 is coupled to the second netlist structure region 904. The third pad region 916 is coupled to the set of third netlist structure regions 906. A pad region defines a region that includes one or more pads that may be coupled to a bump. In some implementations, a pad region may represent the actual pad in an integrated device.

FIG. 9 also illustrates a first set of bumps 922, a second set of bumps 924, and a third set of bumps 926. The first set of bumps 922 is coupled to the first pad region 912. The second set of bumps 924 is coupled to the second pad region 914. The third set of bumps 926 is coupled to the third pad region 916.

In some implementations, the first netlist structure region 902 defines a region of the first and second metal layers that includes one or more interconnects (e.g., traces) that are part of a first netlist. In some implementations, the first netlist structure region 902 defines a contiguous region of the first and second metal layers that includes one or more interconnects (e.g., traces) that are only part of the first netlist. It should be noted that the first netlist structure region 902 does not necessarily represent how the interconnects (e.g., traces) are formed on the first metal layer of the integrated device.

In some implementations, the second netlist structure region 904 defines a region of the first and second metal layers that includes one or more interconnects (e.g., traces) that are part of a second netlist. In some implementations, the second netlist structure region 904 defines a region (e.g., contiguous region) of the first and second metal layers that includes one or more interconnects (e.g., traces) that are only part of the second netlist. It should be noted that the second netlist structure region 904 does not necessarily represent how the interconnects (e.g., traces) are formed on the second metal layer of the integrated device.

In some implementations, the set of third netlist structure region 906 defines regions of the first and second metal layers that include one or more interconnects (e.g., traces) that are part of a third netlist. In some implementations, the set of third netlist structure region 906 defines regions of the first and second metal layers that include one or more interconnects (e.g., traces) that are only part of the third netlist. It should be noted that the third netlist structure region 906 does not necessarily represent how the interconnects (e.g., traces) are formed on the first and second metal layers of the integrated device. As shown in FIG. 9, the set of third netlist structure region 906 includes several regions that are repeated several times in the integrated device. That is, there are several third netlist structure regions that are located in the first metal layer and the second metal layer. In some implementations, each of these third netlist structure regions 902 are spaced apart (e.g., uniformly apart) from each other in a staggered, offset and/or island formation (e.g., star formation, offset formation, staggered formation, hub and spoke formation). In some implementations, two or more first netlist structure regions 902 are electrically coupled to each other through one or more set of via regions 908.

In some implementations, the set of via regions 908 are located in the integrated device such that the set of via regions overlaps (e.g., vertically overlaps) with a third netlist structure region 906 from a first layer and another third netlist structure region from a second layer. Each of the set of via regions 908 may include one or more vias. It should be noted that the set of via regions 908 does not necessarily represent how the vias look between the first and second metal layers of the integrated device.

In some implementations, the first netlist structure region 902, the second netlist structure region 904, and the set of third netlist structure region 906 are configured in the first and second metal layers such that they at least substantially (e.g., about 90% or higher) or completely utilize all of the surface area of the first and second metal layers of the integrated device, thereby maximizing the use of space available for a power distribution network, while at the same time, minimizing parasitic effects, impedance and/or resistance in the power distribution network.

In some implementations, the first netlist structure region 902, the second netlist structure region 904, and the third netlist structure region 906 are separated by one or more non-conducting regions (e.g., dielectric layer).

Figure 10:
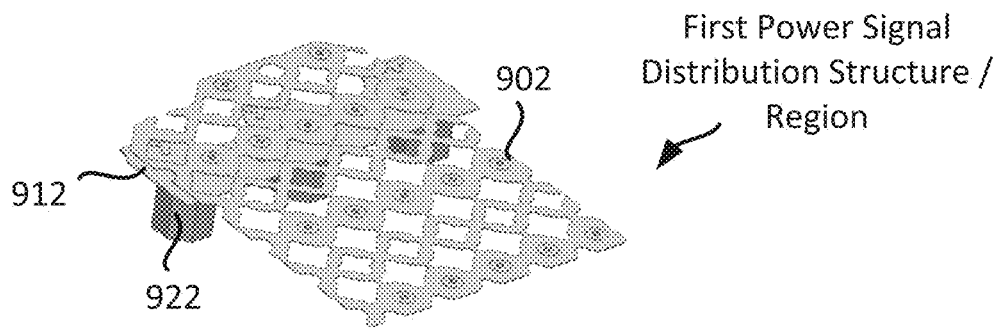
FIG. 10 illustrates an angled view of a first netlist region of a power distribution structure.
Figure 11:
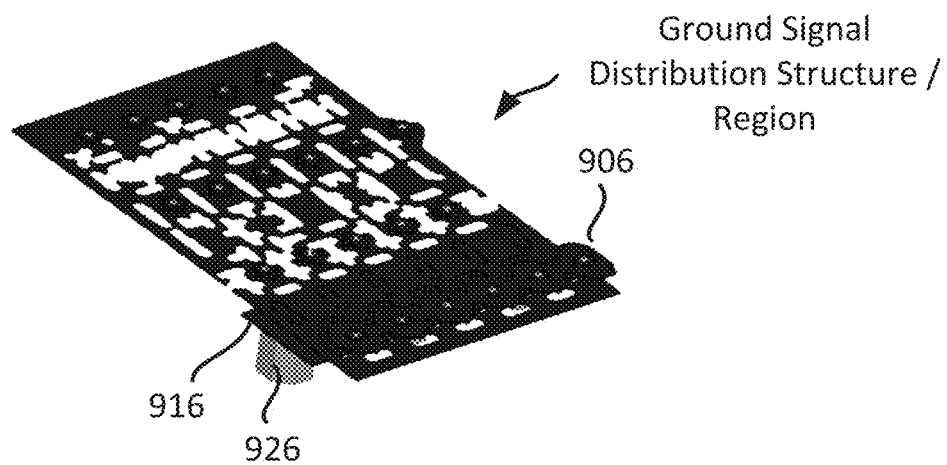
FIG. 11 illustrates an angled view of a second netlist region of a power distribution structure.
Figure 12:
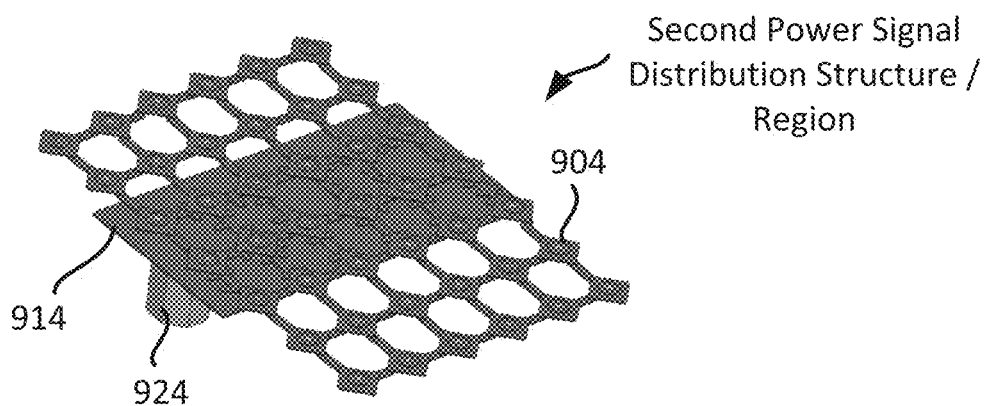
FIG. 12 illustrates an angled view of a third netlist region of a power distribution structure.

FIGS. 10-12 illustrate different regions of the power distribution structure 900 of FIG. 9. FIG. 10 illustrates an angled view of the first netlist structure region 902 of the power distribution structure 900 that may be implemented in an integrated device. As shown in FIG. 10, the first netlist structure region 902 is on a first metal layer of an integrated device. In some implementations, the first netlist structure region 902 is configured to provide a first power signal to/from an integrated device. However, the first netlist structure region 902 may be configured to provide a ground signal to/from an integrated device. In some implementations, the first netlist structure region 902 is formed on the first metal layer such that the first netlist structure region 902 substantially surrounds the third set of netlist structure regions 906. In some implementations, this configuration allows for minimal (about 10% or less) or no overlap of interconnects from different netlists.

It should be noted that the first netlist structure region 902 is a representation of a region in an integrated device that includes a power distribution structure. Thus, in some implementations, the first netlist structure region 902 is not an actual representation of a netlist structure, but rather is one or more regions that includes interconnects that define a netlist structure. However, in some implementations, the first netlist structure region 902 may represent the actual (or close to the actual representation of a) netlist structure of a power distribution network.

FIG. 11 illustrates an angled view of the set of third netlist structure region 906 of the power distribution structure 900 that may be implemented in an integrated device. In some implementations, the set of third netlist structure region 906 is configured to provide a ground signal to/from an integrated device. However, in some implementations, the set of third netlist structure region 906 may be configured to provide a power signal to/from an integrated device.

It should be noted that the set of third netlist structure region 906 is a representation of a region in an integrated device that includes a power distribution structure. Thus, in some implementations, the set of third netlist structure region 906 is not an actual representation of a netlist structure, but rather is one or more regions that includes interconnects that define a netlist structure. However, in some implementations, the set of third netlist structure region 906 may represent the actual (or close to the actual representation of a) netlist structure of a power distribution network.

FIG. 12 illustrates an angled view of the second netlist structure region 904 of the power distribution structure 900 that may be implemented in an integrated device. As shown in FIG. 12, the second netlist structure region 904 is on a second metal layer of an integrated device. In some implementations, the second netlist structure region 904 is configured to provide a second power signal to/from an integrated device. However, the second netlist structure region 904 may be configured to provide a ground signal to/from an integrated device. In some implementations, the second netlist structure region 904 is formed on the second metal layer such that the second netlist structure region 904 substantially surrounds the third set of netlist structure regions 906. In some implementations, this configuration allows for minimal (about 10% or less) or no overlap of interconnects from different netlists. FIG. 12 illustrates that the second netlist structure region 904 includes a repeating pattern of regions.

It should be noted that the second netlist structure region 904 is a representation of a region in an integrated device that includes a power distribution structure. Thus, in some implementations, the second netlist structure region 904 is not an actual representation of a netlist structure, but rather is one or more regions that includes interconnects that define a netlist structure. However, in some implementations, the second netlist structure region 904 may represent the actual (or close to the actual representation of a) netlist structure of a power distribution network.

FIG. 13 illustrates a second metal layer 1300 of the power distribution structure 900. As shown in FIG. 13, the second metal layer 1300 includes the first netlist structure region 902, the second netlist structure region 904, and the set of third netlist structure regions 906.

FIG. 14 illustrates a first metal layer 1400 of the power distribution structure 900. As shown in FIG. 14, the second metal layer 1400 includes the first netlist structure region 902, the second netlist structure region 904, and the set of third netlist structure regions 906.

FIG. 15 illustrates a pad layer 1500 of the power distribution structure 900. As shown in FIG. 15, the second metal layer 1500 includes the first pad region 912, the second pad region 914, and the third pad region 916. In some implementations, the first pad region 912 is configured to couple to the first set of bumps 922. In some implementations, the second pad region 914 is configured to the second set of bumps 924. In some implementations, the third pad region 916 is configured to couple to the third set of bumps 926.

FIGS. 9-15 illustrate how a power distribution network may be substantially evenly spread out over one or more metal layers of an integrated device and/or substrate by dividing the metal layers into different regions (e.g., island regions, contiguous regions), which as described above (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance. In some implementations, one or more of the metal layers includes a set of repeating pattern regions (e.g., island regions) such that about at least 90% of the metal layer is defined by the set of repeating pattern regions. In some implementations, at least one of the metal layers includes at least 100 repeating pattern regions. In some implementations, at least one of the metal layers includes at least 1000 repeating pattern regions.

It should be noted that the one or more regions (e.g., island regions, contiguous regions) may have similar or different sizes and shapes, and is not limited to the sizes and/or shapes shown in FIGS. 9-15. In addition, the use of regions for different netlists is not limited to two metal layers. In some implementations, more than two metal layers of an integrated device or substrate may be implemented with regions that are spaced apart from each other in a staggered, offset, and/or island formation.

Exemplary Power Distribution Structure

Figure 16:
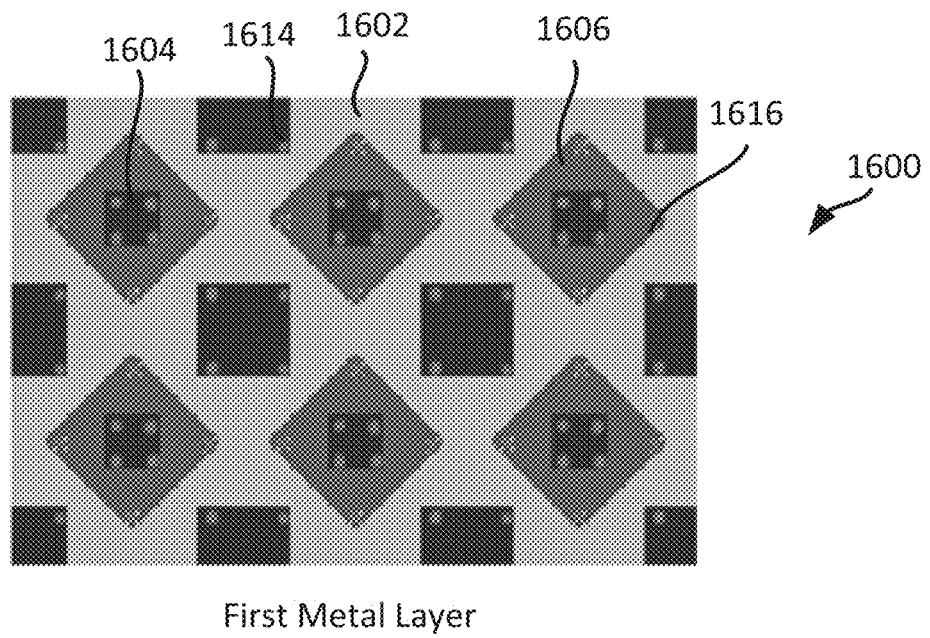
FIG. 16 illustrates a plan view of a first metal layer of a power distribution structure.
Figure 17:
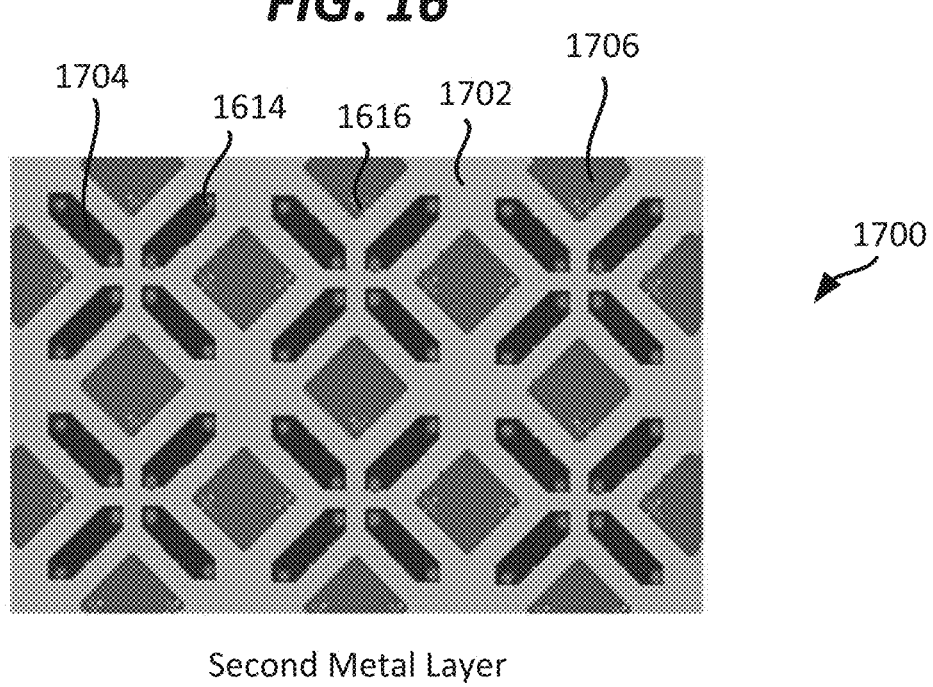
FIG. 17 illustrates a plan view of a second metal layer of a power distribution structure.

A power distribution structure of a power distribution network (PDN) may include more than three netlists. FIGS. 16-17 illustrate an example of a power distribution structure formed on a two metal layers of an integrated device and/or a substrate, where the power distribution structure is configured to accommodate four netlists on two metal layers of an integrated device and/or a substrate.

In some implementations, the power distribution network includes a first netlist, a second netlist and a third netlist. In some implementations, a netlist is defined as a set of interconnects, a set of active elements (e.g., transistor) and/or a set of passive elements (e.g., resistor, capacitor) that form and/or define the connectivity of a circuit in an integrated device. In some implementations, an interconnect may include a trace, a via, a pad, and/or a redistribution metal layer. In some implementations, the first netlist is a first power signal netlist, the second netlist is a second power signal netlist, and the third netlist is a ground signal netlist. In some implementations, the power distribution structure is configured to provide a first power signal, a second power signal, a third power signal and a ground signal to/from an integrated device.

FIG. 16 illustrates a plan view of a first metal layer 1600 of a power distribution structure that may be implemented in an integrated device. The first metal layer 1600 includes a first netlist structure region 1602, a second netlist structure region 1604, and a third netlist structure region 1606. In some implementations, the first netlist structure region 1602 is a first netlist structure. In some implementations, the second netlist structure region 1604 is second netlist structure. In some implementations, the third netlist structure region 1606 is a third netlist structure. FIG. 16 also illustrates a first set of vias 1614 coupled to the second netlist structure region 1604, and a second set of vias 1616 coupled to the third netlist structure region 1606.

In some implementations, the first netlist structure region 1602 defines a region of the first metal layer that includes one or more interconnects (e.g., traces) that are part of a first netlist. In some implementations, the first netlist structure region 1602 defines a repeating region of the first metal layer that includes one or more interconnects (e.g., traces) that are only part of the first netlist. It should be noted that the first netlist structure region 202 does not necessarily represent how the interconnects (e.g., traces) are formed on the first metal layer of the integrated device.

In some implementations, the second netlist structure region 1604 defines a region of the first metal layer that includes one or more interconnects (e.g., traces) that are part of a second netlist. In some implementations, the second netlist structure region 1604 defines a repeating region of the first metal layer that includes one or more interconnects (e.g., traces) that are only part of the second netlist. It should be noted that the second netlist structure region 1604 does not necessarily represent how the interconnects (e.g., traces) are formed on the first metal layer of the integrated device.

In some implementations, the third netlist structure region 1606 defines a region of the first metal layer that includes one or more interconnects (e.g., traces) that are part of a third netlist. In some implementations, the third netlist structure region 1606 defines a repeating region of the first metal layer that includes one or more interconnects (e.g., traces) that are only part of the second netlist. It should be noted that the third netlist structure region 1606 does not necessarily represent how the interconnects (e.g., traces) are formed on the first metal layer of the integrated device.

FIG. 17 illustrates a plan view of a second metal layer 1700 of a power distribution structure that may be implemented in an integrated device. The second metal layer 1700 includes a fourth netlist structure region 1702, a fifth netlist structure region 1704, and a sixth netlist structure region 1706. In some implementations, the fourth netlist structure region 1702 is a fourth netlist structure. In some implementations, the fifth netlist structure region 1704 is fifth netlist structure. In some implementations, the sixth netlist structure region 1706 is a sixth netlist structure. FIG. 17 also illustrates the first set of vias 1614 coupled to the fifth netlist structure region 1704, and the second set of vias 1616 coupled to the sixth netlist structure region 1706.

In some implementations, the fourth netlist structure region 1702 defines a region of the second metal layer that includes one or more interconnects (e.g., traces) that are part of a fourth netlist. In some implementations, the fourth netlist structure region 1702 defines a repeating region of the second metal layer that includes one or more interconnects (e.g., traces) that are only part of the fourth netlist. It should be noted that the fourth netlist structure region 1702 does not necessarily represent how the interconnects (e.g., traces) are formed on the second metal layer of the integrated device.

In some implementations, the fifth netlist structure region 1704 defines a region of the second metal layer that includes one or more interconnects (e.g., traces) that are part of the second netlist. In some implementations, the fifth netlist structure region 1704 defines a repeating region of the second metal layer that includes one or more interconnects (e.g., traces) that are only part of the second netlist. It should be noted that the fifth netlist structure region 1704 does not necessarily represent how the interconnects (e.g., traces) are formed on the second metal layer of the integrated device.

In some implementations, the sixth netlist structure region 1706 defines a region of the second metal layer that includes one or more interconnects (e.g., traces) that are part of the third netlist. In some implementations, the sixth netlist structure region 1706 defines a repeating region of the second metal layer that includes one or more interconnects (e.g., traces) that are only part of the third netlist. It should be noted that the sixth netlist structure region 1706 does not necessarily represent how the interconnects (e.g., traces) are formed on the second metal layer of the integrated device.

In some implementations, the first metal layer 1600 and the second metal layer 1700 form a power distribution structure that may be implemented in different parts of an integrated device and/or substrate. In some implementations, the power distribution is configured to provide four (4) netlist structures in two metal layers. In some implementations, the power distribution structure may be implemented in a printed circuit board (PCB), a package substrate, a redistribution portion (e.g., redistribution layers) of a die, a wafer level die, a wafer level package (WLP), an embedded wafer level package (eWLP), an embedded wafer level ball grid array (eWLB), and/or an integrated fan out (INFO) wafer level package.

In some implementations, the power distribution structure provides several advantages to an integrated device. For example, when the power distribution structure is coupled to several bumps and/or solder balls, the even distribution of the power distribution structure across the entire metal layer(s) of the integrated device (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance.

In some implementations, the power distribution structure is configured in such a way as to minimize parasitic effects on the power distribution network. In some implementations, this is achieved by reducing and/or minimizing the number of overlaps (e.g., vertical overlaps) between interconnects from different netlist structures. For example, a first interconnect from a first netlist may be placed on a first metal layer such that it does not overlap (e.g., vertically overlap) with a second interconnect from a second netlist on a second metal layer.

In some implementations, the first netlist structure region 1602, the second netlist structure region 1604, the third netlist structure region 1606, a fourth netlist structure region 1702, a fifth netlist structure region 1704, and/or the sixth netlist structure region 1706 are configured in the first and second metal layers such that they at least substantially (e.g., about 90% or higher) or completely utilize all of the surface area of the first and second metal layers of the integrated device, thereby maximizing the use of space available for a power distribution network, while at the same time, minimizing parasitic effects, impedance and/or resistance in the power distribution network.

Figure 18:
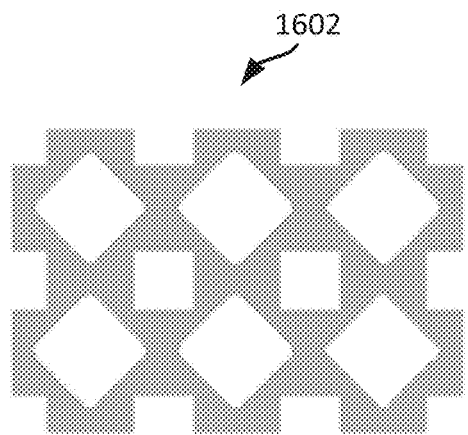
FIG. 18 illustrates a plan view of first netlist region of a power distribution structure.

FIGS. 18-21 illustrate different netlist structure regions of a power distribution structure of FIGS. 16-17. FIG. 18 illustrates a plan view of the first netlist structure region 1602 of a power distribution structure. In some implementations, the first netlist structure region 1602 is a first netlist structure. In some implementations, the first netlist structure region 1602 is configured to provide a first netlist for a power distribution network. In some implementations, the first netlist structure region 1602 is located on a first metal layer. As shown in FIG. 18, the first netlist structure region 1602 has a first repeating pattern.

Figure 19:
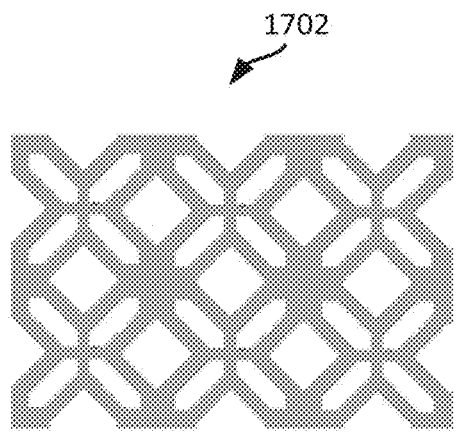
FIG. 19 illustrates a plan view of a second netlist region of a power distribution structure.

FIG. 19 illustrates a plan view of the second netlist structure region 1702 of a power distribution structure. In some implementations, the second netlist structure region 1702 is a second netlist structure. In some implementations, the second netlist structure region 1702 is configured to provide a second netlist for a power distribution network. In some implementations, the second netlist structure region 1702 is located on a second metal layer. As shown in FIG. 19, the second netlist structure region 1702 has a first repeating pattern.

Figure 20:
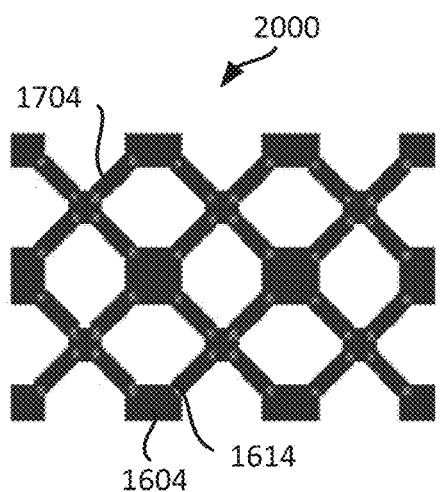
FIG. 20 illustrates a plan view of a third netlist region of a power distribution structure.

FIG. 20 illustrates a plan view of a third netlist structure region 2000 of a power distribution structure. In some implementations, the third netlist structure region 2000 is a third netlist structure. In some implementations, the third netlist structure region 2000 is configured to provide a third netlist for a power distribution network. In some implementations, the third netlist structure region 2000 is located on the first and second metal layers. The third netlist structure region 2000 includes the second netlist structure region 1604, the fifth netlist structure region 1704, and the first set of vias 1614. The second netlist structure region 1604 is on the first metal layer. The fifth netlist structure region 1704 is on the second metal layer. The second netlist structure region 1604 is coupled to the fifth netlist structure region 1704 is coupled through the first set of vias 1614. As shown in FIG. 20, the third netlist structure region 2000 has a third repeating pattern.

Figure 21:
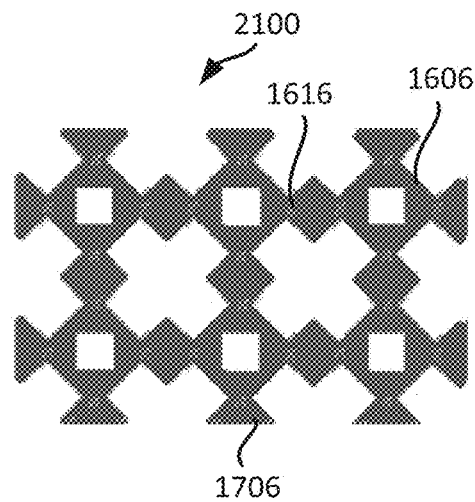
FIG. 21 illustrates a plan view of a fourth netlist region of a power distribution structure.

FIG. 21 illustrates a plan view of a fourth netlist structure region 2100 of a power distribution structure. In some implementations, the fourth netlist structure region 2100 is a fourth netlist structure. In some implementations, the fourth netlist structure region 2100 is configured to provide a fourth netlist for a power distribution network. In some implementations, the fourth netlist structure region 2100 is located on the first and second metal layers. The fourth netlist structure region 2100 includes the third netlist structure region 1606, the sixth netlist structure region 1706, and the second set of vias 1616. The third netlist structure region 1606 is on the first metal layer. The sixth netlist structure region 1706 is on the second metal layer. The third netlist structure region 1606 is coupled to the sixth netlist structure region 1706 is coupled through the second set of vias 1616. As shown in FIG. 21, the fourth netlist structure region 2100 has a fourth repeating pattern.

It should be noted that in some implementations, a netlist structure region is a representation of a region in an integrated device and/or substrate that includes a power distribution structure. Thus, in some implementations, a netlist structure region is not an actual representation of a netlist structure, but rather is one or more regions that includes interconnects that define a netlist structure. However, in some implementations, the netlist structure region may represent the actual (or close to the actual representation of a) netlist structure of a power distribution network.

FIGS. 16-21 illustrate how a power distribution network may be substantially evenly spread out over one or more metal layers of an integrated device and/or substrate by dividing the metal layers into different regions (e.g., island regions, contiguous regions), which as described above (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance. In some implementations, one or more of the metal layers includes a set of repeating pattern regions (e.g., island regions) such that about at least 90% of the metal layer is defined by the set of repeating pattern regions. In some implementations, at least one of the metal layers includes at least 100 repeating pattern regions. In some implementations, at least one of the metal layers includes at least 1000 repeating pattern regions.

It should be noted that the one or more of the regions (e.g., island regions, contiguous regions) may have similar or different sizes and shapes, and is not limited to the size and/or shapes shown in FIGS. 16-21. In addition, the use of regions for different netlists is not limited to two metal layers. In some implementations, more than two metal layers of an integrated device or substrate may be implemented with regions that are spaced apart from each other in a staggered, offset, and/or island formation.

Exemplary Method For Providing a Power Distribution Network

Figure 22:
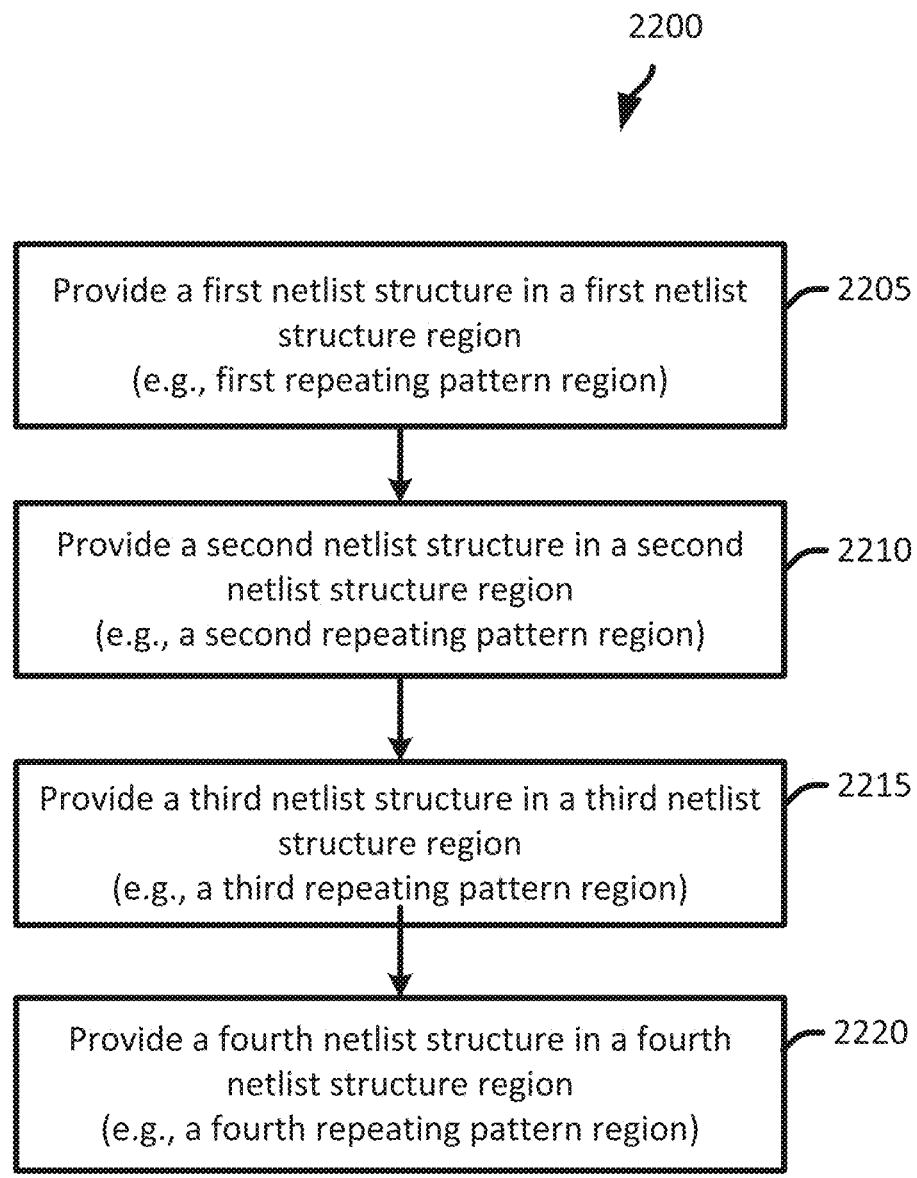
FIG. 22 illustrates a flow diagram of a method for providing a power distribution structure.

FIG. 22 illustrates a flow diagram of a method for providing (e.g., fabricating) a power distribution network for an integrated device and/or a substrate.

The method provides (at 2205) a first netlist structure region in an integrated device. In some implementations, providing (e.g., forming) the first netlist structure region (e.g., netlist structure region 206) includes providing a first netlist structure region that includes a set of interconnects (e.g., traces) on at least one metal layer (e.g., first metal layer) of an integrated device and/or a substrate (e.g., package substrate). In some implementations, the first netlist structure region includes a set of repeating regions on a first metal layer of an integrated device and/or substrate. In some implementations, the first netlist structure region includes another set of repeating regions on a second metal layer of an integrated device and/or substrate. In some implementations, the first netlist structure region includes a first netlist structure that is configured to provide a power signal or ground signal to/from an integrated device.

The method further provides (at 2210) a second netlist structure region in an integrated device. In some implementations, providing (e.g., forming) the second netlist structure region (e.g., netlist structure region 202) includes providing a second netlist structure region that includes a set of interconnects (e.g., traces) on at least one metal layer (e.g., first metal layer) of an integrated device and/or a substrate (e.g., package substrate). In some implementations, the second netlist structure region includes a set of repeating regions on a first metal layer of an integrated device and/or substrate. In some implementations, the second netlist structure region includes another set of repeating regions on a second metal layer of an integrated device and/or substrate. In some implementations, the second netlist structure region includes a second netlist structure that is configured to provide a power signal or ground signal to/from an integrated device.

The method also provides (at 2215) a third netlist structure region in an integrated device. In some implementations, providing (e.g., forming) the third netlist structure region (e.g., netlist structure region 204) includes providing a third netlist structure region that includes a set of interconnects (e.g., traces) on at least one metal layer (e.g., first metal layer) of an integrated device and/or a substrate (e.g., package substrate). In some implementations, the third netlist structure region includes a set of repeating regions on a first metal layer of an integrated device and/or substrate. In some implementations, the third netlist structure region includes another set of repeating regions on a second metal layer of an integrated device and/or substrate. In some implementations, the third netlist structure region includes a first netlist structure that is configured to provide a power signal or ground signal to/from an integrated device.

The method may optionally provide (at 2220) a fourth netlist structure region in an integrated device. In some implementations, providing (e.g., forming) the fourth netlist structure region (e.g., netlist structure region 2100) includes providing a fourth netlist structure region that includes a set of interconnects (e.g., traces) on at least one metal layer (e.g., first metal layer) of an integrated device and/or a substrate (e.g., package substrate). In some implementations, the fourth netlist structure region includes a set of repeating regions on a first metal layer of an integrated device and/or substrate. In some implementations, the fourth netlist structure region includes another set of repeating regions on a second metal layer of an integrated device and/or substrate. In some implementations, the fourth netlist structure region includes a fourth netlist structure that is configured to provide a power signal or ground signal to/from an integrated device.

In some implementations, the first netlist structure region, the second netlist structure region, and the third netlist structure region, and/or the fourth netlist structure region are configured in the first and second metal layers such that they at least substantially (e.g., about 90% or higher) or completely utilize all of the surface area of the first and second metal layers of the integrated device, thereby maximizing the use of space available for a power distribution network, while at the same time, minimizing parasitic effects, impedance and/or resistance in the power distribution network.

FIG. 22 illustrates an example of a method of how to provide (e.g., form) a power distribution network that is substantially evenly spread out over one or more metal layers of an integrated device and/or substrate by dividing the metal layers into different regions (e.g., island regions, contiguous regions), which as described above (1) provides lower inductance and lower resistance between a bump and a solder ball, and (2) more evenly spreads out bump to solder ball inductance and resistance (e.g., less variance in inductance and resistance between different combination of bumps to solder balls), which leads to better signal performance and thus better integrated device performance. In some implementations, one or more of the metal layers includes a set of repeating pattern regions (e.g., island regions) such that about at least 90% of the metal layer is defined by the set of repeating pattern regions. In some implementations, at least one of the metal layers includes at least 100 repeating pattern regions. In some implementations, at least one of the metal layers includes at least 1000 repeating pattern regions.

It should be noted that the one or more regions (e.g., island regions, contiguous regions) may have similar or different sizes and shapes, and is not limited to the sizes and/or shapes shown in present disclosure. In addition, the use of regions for different netlists is not limited to two metal layers. In some implementations, more than two metal layers of an integrated device or substrate may be implemented with regions that are spaced apart from each other in a staggered, offset, and/or island formation.

Exemplary Electronic Devices

Figure 23:
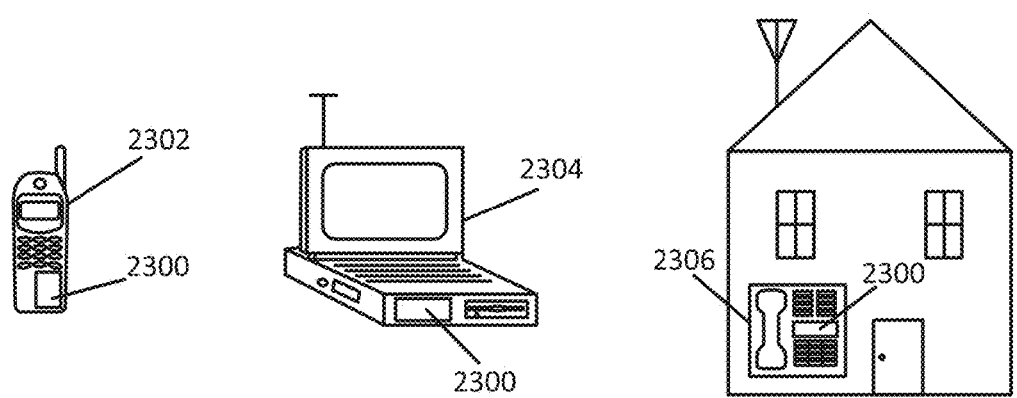
FIG. 23 illustrates various electronic devices that may integrate an integrated device, substrate, and/or PCB described herein.

FIG. 23 illustrates various electronic devices that may be integrated with any of the aforementioned integrated device (e.g., semiconductor device), integrated circuit, die, interposer and/or package. For example, a mobile telephone 2302, a laptop computer 2304, and a fixed location terminal 2306 may include an integrated device 2300 as described herein. The integrated device 2300 may be, for example, any of the integrated devices, integrated circuits, dice or packages described herein. The devices 2302, 2304, 2306 illustrated in FIG. 23 are merely exemplary. Other electronic devices may also feature the integrated device 2300 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18, 19, 20, 21, 22, and/or 23 may be rearranged and/or combined into a single component, step, feature or function or embodied in several components, steps, or functions. Additional elements, components, steps, and/or functions may also be added without departing from the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

The terms "region", "netlist region", and "netlist structure region" are used throughout the present application. In some implementations, a "region", "netlist region", and/or "netlist structure region" is a region of the integrated device and/or substrate that is defined by actual physical boundaries (e.g., boundaries between metal layer and dielectric layer). In some implementations, a "region", "netlist region", and/or "netlist structure region" is a region of the integrated device and/or substrate that is defined by abstract or conceptual boundaries (e.g., boundaries as defined in an integrated circuit/device layout). These abstract or conceptual boundaries may be similar or aligned to actual physical boundaries and/or they may be arbitrarily defined in the integrated device and/or the substrate.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

It should also be noted the inductors described in the present disclosure may be implemented in other portions of a device. For example, in some implementations, the inductors described in the present disclosure may be implemented (e.g., manufactured, provided) in a printed circuit board (PCB) and/or a die (e.g., in lower metal layers and dielectric layers of a die), using known manufacturing processes.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
    a first metal layer comprising a first set of regions and a first plurality of third regions, the first set of regions comprising a first netlist structure for a power distribution network (PDN) of the integrated device, the first netlist structure configured to distribute a first power signal, wherein the first netlist structure comprises a first set of interconnects, a first set of active elements and/or a first set of passive elements that form a first circuit for the integrated device; and
    a second metal layer comprising a second set of regions and a second plurality of third regions, the second set of regions comprising a second netlist structure for the PDN of the integrated device, the second netlist structure configured to distribute a second power signal, wherein the second netlist structure comprises a second set of interconnects, a second set of active elements and/or a second set of passive elements that form a second circuit for the integrated device;
    wherein the first plurality of third regions from the first metal layer and the second plurality of third regions from the second metal layer, define a third set of regions comprising a third netlist structure configured to provide a ground,
    wherein a region, from first plurality of third regions, on the first metal layer is located laterally between first regions from the first set of regions that includes the first netlist structure configured to distribute the first power signal,
    wherein another region, from the second plurality of third regions, on the second metal layer is located laterally between second regions from the second set of regions that includes the second netlist structure configured to distribute the second power signal.

2. The integrated device of claim 1, wherein the second metal layer further comprises another set of regions comprising the first netlist structure for the PDN of the integrated device.

3. The integrated device of claim 1, wherein the second metal layer further comprises another set of regions being island regions comprising the first netlist structure for the PDN of the integrated device.

4. The integrated device of claim 1, wherein the first plurality of third regions includes regions that are non-overlapping with at least the first set of regions of the first metal layer.

5. The integrated device of claim 1, further comprising a set of vias configured to couple the first set of regions.

6. The integrated device of claim 1, wherein the first set of regions includes a set of repeating pattern regions that defines a substantial portion of the first metal layer.

7. The integrated device of claim 1, wherein the first set of regions includes a set of repeating pattern regions formed in one of at least a star formation, an offset formation, a staggered formation, and/or a hub and spoke formation.

8. The integrated device of claim 1, wherein the third netlist structure comprises a third set of interconnects, a third set of active elements and/or a third set of passive elements that form a third circuit for the integrated device.

9. The integrated device of claim 1, wherein the power distribution network (PDN) is incorporated in one of at least a printed circuit board (PCB), a redistribution portion of a die, a wafer level die, a wafer level package (WLP), an embedded wafer level package (eWLP), an embedded wafer level ball grid array (eWLB), and/or an integrated fan out (INFO) wafer level package.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. A substrate for an integrated device comprising:
a first metal layer comprising a first set of regions and a first plurality of third regions, the first set of regions comprising a first netlist structure for a power distribution network (PDN) of the substrate, the first netlist structure configured to distribute a first power signal, wherein the first netlist structure comprises a first set of interconnects, a first set of active elements and/or a first set of passive elements that form a first circuit for the substrate; and
a second metal layer comprising a second set of regions and a second plurality of third regions, the second set of regions comprising a second netlist structure for the PDN of the substrate, the second netlist structure configured to distribute a second power signal, wherein the second netlist structure comprises a second set of interconnects, a second set of active elements and/or a second set of passive elements that form a second circuit for the substrate;
wherein the first plurality of third regions from the first metal layer and the second plurality of third regions from the second metal layer, define a third set of regions comprising a third netlist structure configured to provide a ground,
wherein a region, from first plurality of third regions, on the first metal layer is located laterally between first regions from the first set of regions that includes the first netlist structure configured to distribute the first power signal,
wherein another region, from the second plurality of third regions, on the second metal layer is located laterally between second regions from the second set of regions that includes the second netlist structure configured to distribute the second power signal.

12. The substrate of claim 11, wherein the second metal layer further comprises another set of regions comprising the first netlist structure for the PDN of the substrate.

13. The substrate of claim 11, wherein the second metal layer further comprises another set of regions being island regions comprising the first netlist structure for the PDN of the substrate.

14. The substrate of claim 11, wherein the first plurality of third regions includes regions that are non-overlapping with at least the first set of regions of the first metal layer.

15. The substrate of claim 11, further comprising a set of vias configured to couple the first set of regions.

16. The substrate of claim 11, wherein the first set of regions includes a set of repeating pattern regions that defines a substantial portion of the first metal layer.

17. The substrate of claim 11, wherein the first set of regions includes a set of repeating pattern regions formed in one of at least a star formation, an offset formation, a staggered formation, and/or a hub and spoke formation.

18. The substrate of claim 11, wherein the third netlist structure comprises a third set of interconnects, a third set of active elements and/or a third set of passive elements that form a third circuit for the substrate.

19. The substrate of claim 11, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

20. The integrated device of claim 1, wherein the first netlist structure is a first circuit structure comprising the first set of interconnects on the first metal layer, wherein the second netlist structure is a second circuit structure comprising the second set of interconnects on the second metal layer, wherein the third netlist structure is a third circuit structure comprising a third set of interconnects on the first metal layer and the second metal layer, and wherein the plurality of first interconnects vertically overlaps with plurality of second interconnects by about 10 percent (10%) or less.

21. The integrated device of claim 1, wherein the first set of regions, the second set of regions and the third set of regions are configured to utilize at least about ninety percent (90%) of the combined surface area of the first metal layer and the second metal layer.

22. The integrated device of claim 21, wherein the first set of regions vertically overlaps with the second set of regions by about 10 percent (10%) or less.

23. The integrated device of claim 1, wherein the third set of regions is formed on the first metal layer such that the third set of regions substantially surrounds the first set of regions.

24. The integrated device of claim 23, wherein the third set of regions is formed on the second metal layer such that the third set of regions substantially surrounds the second set of regions.

25. The integrated device of claim 1, wherein the first metal layer includes a metal and a dielectric.

26. The integrated device of claim 1, wherein the first set of regions comprises a first set of repeating regions, wherein the second set of regions comprises a second set of repeating regions, and wherein the third set of regions comprises a third set of repeating regions.

27. The substrate of claim 11, wherein the first netlist structure is a first circuit structure comprising the first set of interconnects on the first metal layer, wherein the second netlist structure is a second circuit structure comprising the second set of interconnects on the second metal layer, wherein the third netlist structure is a third circuit structure comprising a third set of interconnects on the first metal layer and the second metal layer, and wherein the plurality of first interconnects vertically overlaps with plurality of second interconnects by about 10 percent (10%) or less.

28. The substrate of claim 11, wherein the first set of regions, the second set of regions and the third set of regions are configured to utilize at least about ninety percent (90%) of the combined surface area of the first metal layer and the second metal layer.

29. The substrate of claim 28, wherein the first set of regions vertically overlaps with the second set of regions by about 10 percent (10%) or less.

30. The substrate of claim 11, wherein the power distribution network (PDN) for the substrate consists of the first metal layer and the second metal layer.

* * * * *